United States Patent [19]

Wanat et al.

[11] Patent Number: 6,121,412

[45] Date of Patent: Sep. 19, 2000

[54] PREPARATION OF FRACTIONATED NOVOLAK RESINS BY A NOVEL EXTRACTION TECHNIQUE

[75] Inventors: Stanley F. Wanat, Scotch Plains; M. Dalil Rahman, Somerville, both of N.J.; John J. Kokoszka, Warwick, R.I.; Balaji Narasimhan, Highland Park, N.J.

[73] Assignee: Clariant Finance (BVI) Limited, Virgin Islands (Br.)

[21] Appl. No.: 09/418,239

[22] Filed: Oct. 14, 1999

Related U.S. Application Data

[63] Continuation-in-part of application No. 09/190,763, Nov. 12, 1998, abandoned.

[51] Int. Cl.[7] ................................. C08F 6/04; C08F 6/22; C08G 14/04
[52] U.S. Cl. ..................... 528/502 D; 528/129; 528/144; 528/491; 430/270.1; 438/455; 438/689; 427/352; 427/372.2; 210/634
[58] Field of Search ................................. 528/502 D, 129, 528/144, 491; 430/270.1; 427/352, 372.2; 210/634; 438/455, 689

[56] References Cited

U.S. PATENT DOCUMENTS

| | | | |
|---|---|---|---|
| 5,371,169 | 12/1994 | Lee et al. | 525/480 |
| 5,374,693 | 12/1994 | Lynch et al. | 525/501 |
| 5,521,052 | 5/1996 | Rahman et al. | 430/270.1 |
| 5,646,218 | 7/1997 | Lynch et al. | 525/501 |
| 5,665,517 | 9/1997 | Rahman et al. | 430/270.1 |
| 5,693,749 | 12/1997 | Rahman et al. | 528/482 |
| 5,739,265 | 4/1998 | Rahman et al. | 528/482 |
| 5,750,632 | 5/1998 | Rahman et al. | 528/129 |

*Primary Examiner*—Duc Truong
*Attorney, Agent, or Firm*—Andrew F. Sayko, Jr.

[57] ABSTRACT

The present invention provides a method for producing a film forming, fractionated novolak resin, by:

a) condensing formaldehyde with one or more phenolic compounds, and thereby producing a novolak resin;

b) adding a photoresist solvent, and optionally a water-soluble organic polar solvent;

c) feeding the mixture into a liquid/liquid centrifuge and feeding a $C_5$–$C_8$ alkane, water or aromatic hydrocarbon solvent into the liquid/liquid centrifuge at a ratio of optional water-soluble organic polar solvent and photoresist solvent to $C_5$–$C_8$ alkane, water or aromatic solvent, of from 5:1 to 0.5:1;

d) rotating the liquid/liquid centrifuge containing the mixture at a speed of at least 500 rpm and thereby separating the mixture into two phases, collecting the two phases;

e) optionally separating the lighter phase (L) into two second phases;

f) removing residual $C_5$–$C_8$ alkane, water or aromatic hydrocarbon solvent from the heavier phase (H) from step d) and leaving the novolak resin dissolved in the photoresist solvent;

A method is also provided for producing photoresist composition from such a fractionated novolak resin and for producing microelectronic devices using such a photoresist composition.

33 Claims, No Drawings

PREPARATION OF FRACTIONATED NOVOLAK RESINS BY A NOVEL EXTRACTION TECHNIQUE

This application is a continuation in part of U.S. patent application Ser. No. 09/190,763 filed on Nov. 12, 1998, now abandoned.

BACKGROUND OF THE INVENTION

The present invention relates to a process for producing a fractionated film forming novolak resin with good lithographic performance in light sensitive photoresist compositions, and for using such a novolak resin in such light-sensitive compositions. The present invention also relates to a process for fractionating novolak resin by continuous liquid/liquid extraction utilizing a liquid/liquid centrifuge and using such a fractionated resin for making a high quality light-sensitive positive-working photoresist composition. Further, the present invention relates to a process for coating substrates with these light-sensitive compositions, as well as the process of coating, imaging and developing these light-sensitive mixtures on such substrates.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Novolak resins are frequently used as the polymeric binder in liquid photoresist formulations. These resins are typically produced by a condensation reaction between formaldehyde and one or more multi-substituted phenols, in the presence of an acid catalyst, such as oxalic acid, maleic acid, or maleic anhydride. In producing sophisticated microelectronic devices, it has become increasingly important to provide a film forming novolak resin of superior quality in terms of dissolution rate, better binding properties with a diazonaphthoquinone photoactive compound, and good heat resistance.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

DESCRIPTION OF THE PRIOR ART

In the recent years there has been significant progress in novolak resin synthesis and fractionation. It has been reported that under vigorous synthetic conditions the structure of novolak resin changes, especially when high concentration of acid catalyst and high temperature is used, Rahman et al, "Rearrangement of Novolak Resin", presented at SPIE conference, 1994; Khadim et al "The Nature and Degree of Substitution Patterns in Novolaks by Carbon-13 NMR Spectroscopy", presented at SPIE conference, 1993. In a typical novolak reaction, a reactor is charged with phenolic compounds, an acid catalyst such as oxalic acid, maleic acid, p-toluene sulphonic acid or any mineral acid, and heated to about 95 to 100° C. Formaldehyde is slowly added and the mixture is heated at reflux for about 6 hours. At the end of the condensation period, the reactor is converted to distillation, and the temperature is raised to about 200° C. At this point vacuum is slowly drawn, the temperature is raised to about 220° C., and the pressure is reduced to below about 20 mm Hg. After the volatiles have been distilled off, the vacuum is released and the molten resin collected and allowed to cool. During the course of the above resin synthesis sequence, samples were taken at various temperatures and inspected by GPC (Gel Permeation Chromatography). It was found that there was a decrease of the weight average molecular weight (all molecular weights are weight average unless otherwise specified) of the polymer, especially in the temperature range between about 160–190° C. (Rahman et al, "The Effect of Lewis Bases on the Molecular Weight of Novolak Resins", presented at Ellenville Conference, 1994). The molecular weight decrease (partial depolymerization) was not observed unless the phenolic compounds are extremely pure. If the phenolic compounds contain a trace amount of a Lewis Base, such as a nitrogen base, the molecular weight decrease during the distillation process was not observed. In U.S. Pat. No. 5,476,750, assigned to the same assignee as the subject application and incorporated herein by reference, an improved process is disclosed to control molecular weight (avoid substantial depolymerization) by adjusting the amount of Lewis Base in the phenolic compounds before or after the condensation reaction. It was disclosed that during the purification process of such phenolic compounds using an ion exchange resin, distillation, and/or a solvent extraction process, to remove metal ions, the minor amount of Lewis Base present was also removed. Due to the absence of this base, the novolak resin was partially depolymerized during the manufacturing process. The physical properties of the depolymerized resin changed due to degradation, and it using subsurface forced steam distillation to avoid high temperature molecular weight breakdown of the resin. (Rahman et al, "Isolation of Novolak Resin at Low Temperature", presented at SPIE Conference, 1996). It is known that a film forming novolak resin can be made by the condensation reaction of a mixture of phenolic monomers with an aldehyde source. Such novolak resin synthesis processes are disclosed in U.S. Pat. No. 5,346,799, incorporated herein by reference.

SUMMARY OF THE INVENTION

The present novolak resin fractionation/separation process isolates novolak resin fractions from the phenol formaldehyde condensation product using selective distribution between immiscible liquids in a liquid/liquid centrifuge. The present process is an effective way of continuously or semi-continuously isolating (fractionating and then separating) novolak resin fractions with most of the undesirable lower molecular weight materials removed. It avoids multiple high temperature distillations, which can lead to partial depolymerization of the novolak resin.

This can be accomplished by dissolving the novolak resin in a typical photoresist solvent such as propylene glycol methyl ether, propylene glycol methyl ether acetate (PGMEA), 2-heptanone (methyl amyl ketone) or ethyl lactate (EL), optionally mixed with a water-soluble organic polar solvent such as acetone, dimethylformamide (DMF), dimethylsulfoxide (DMS), tetrahydrofuran (THF), ethylene glycol or a $C_1$–$C_5$, (preferably $C_1$–$C_3$) alkyl alcohol, such as ethanol, propanol or, preferably, methanol. This solution comprises the resin layer (A). Another solvent chosen from one or more $C_1$–$C_8$ alkanes (such as pentane, hexane or heptane), water, or one or more aromatic hydrocarbon solvents such as benzene, toluene, or xylenol or other $C_1$–$C_5$ alkyl benzenes, comprises solvent layer (B).

Layers (A) and (B) are each fed, either: 1) together as a mixture through one inlet feed, 2) together without being pre-mixed through one inlet feed, or 3) separately through two different inlet feeds, into a liquid/liquid centrifuge (such as one available from CINC, Inc., Carson City, Nevada), where two immiscible liquid layers are initially formed. The heavier or bottom layer contains the high molecular weight (from about 20% to about 100% greater than that of the starting novolak resin fraction) and the lighter layer contains a mixture of solvents and the lower molecular weight resin fractions (removed from the total distribution of molecular weight). When the optional second solvent (the water-soluble organic polar solvent) is utilized, the lighter or top layer may optionally be further separated into 2 second separate layers, in addition to the heavy layer that has already been formed. However, the force of the revolving centrifuge keeps these 2 second separate layers intermixed until they exit from the centrifuge and are allowed to separate. The optional upper layer of this new lighter 2-layer mixture contains primarily the $C_5$–$C_8$ alkane, water or aromatic hydrocarbon solvent with a very small amount of the optional water-soluble organic polar solvent and the photoresist solvent, while the lower layer contained higher levels of the optional water-soluble organic polar solvent and the photoresist solvent, along with about 10–90%, normally 10–30%, by weight of novolak low molecular weight oligomers (generally in the range of from about 5% to 40% of the molecular weight of the original novolak resin).

The heavier layer or bottom layer and the lighter layer that subsequently optionally separates into two separate phases are each removed from the centrifuge through separate outlets. Either the level of these two outlets may be adjusted or the pressure required to feed liquid through each of the two inlets may be adjusted. By adjusting the inlet feed solutions and maintaining fresh supplies of both: 1) the resin in the photoresist solvent with the optional water-soluble organic water soluble solvent, and 2) the $C_5$–$C_8$ alkane, water or aromatic hydrocarbon solvent, a substantially continuous process is possible.

Subsequent concentration of the heaviest liquid resin layer, such as by distillation of the lower boiling solvents, isolates a fractionated novolak resin solution in the photoresist solvent. This novolak resin solution can then be used directly in the preparation of a photoresist formulation, without the need for more time-consuming isolation steps that could seriously affect the overall molecular weight distribution and polydispersity (Weight Average Molecular Weight/Number Average Molecular weight) of the novolak resin.

The ratio of the resin layer (A) to solvent layer (B) is typically different for each novolak resin system comprised of the 2, or optionally 3, types of solvents and the novolak resin, if the molecular weight or molecular weight distribution of the starting unfractionated novolak resin is different. Practical limits for the amount of optional water-soluble organic polar solvent are dictated by the necessary formation of discrete immiscible layers. For example, the ratio of photoresist solvent (e.g. EL) to water-soluble organic polar solvent (e.g. MeOH) is from 10/90 to 100/0, preferably from 10/90 to 70/30, most preferably from 30/70 to 60/40, and the ratio of the resin layer (A) solution to the $C_5$–$C_8$ alkane, water or aromatic solvent layer (B) is from 5/1 to 0.5/1, preferably from 2/1 to 1/0.75. These ratios define the most useful ranges where the most efficient separation occurs.

The typical photoresist solvent utilized in the process of the present invention may comprise propylene glycol methyl ether acetate, 3-methoxy-3-methyl butanol, 2-heptanone (methyl amyl ketone), ethylene glycol monomethyl ether, ethylene glycol monoethyl ether, diethylene glycol monoethyl ether, ethylene glycol monoethyl ether acetate, ethylene glycol monomethyl acetate, methyl ethyl ketone or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, or propyl 2-methoxy propionate, or mixtures of one or more of these solvents.

The present invention relates to a process for continuously fractionating and separating a film-forming novolak resin. The final fractionated and separated novolak resin is dissolved in one essentially pure photoresist solvent, and is substantially free from lower molecular weight isomers and unreacted starting materials. In addition, the isolated novolak resin solution can then be easily used without the need for additional time consuming and costly isolation steps. A novolak resin solution useful for formulation into photoresist formulations can be provided by removing the small amounts of lower boiling solvents present, such as by simply distilling off, until the solvent remaining is substantially the pure photoresist solvent of choice. Additional isolation steps that were commonly needed have been shown to cause rearrangement, decomposition and unacceptable increases in overall resin polydispersity. The fractionated novolak resins of the present invention exhibit very good lithographic performance in light-sensitive photoresist compositions. The invention also relates to a process for producing a photoresist containing such a novolak resin. The invention further relates to a process for producing microelectronic devices using photoresists containing such a novolak resin, photoresist solvent(s), and a photoactive compound.

Film-forming novolak resins having substantially consistent molecular weight (no substantial depolymerization) and relatively low polydispersity lend themselves to superior lithographic performance when incorporated into photoresist compositions. The novolak resins may be obtained by condensing a formaldehyde with one or more phenolic compounds, such as m-cresol, p-cresol, 2,4- and 2,5-dimethylphenol, 3,5-dimethylphenol, 2,3,5-trimethylphenol. The condensation reaction is preferably carried out in the presence of a catalytic amount of an acid catalyst, such as oxalic acid, maleic acid, maleic anhydride, p-toluene sulphonic acid or sulfuric acid.

The present invention provides a process for producing a film forming novolak resin, which process comprises:
a) condensing (reacting) formaldehyde, para formaldehyde or formalin with one or more phenolic compounds, in the presence of a catalytic amount of an acid catalyst, and thereby producing a novolak resin;
b) adding a photoresist solvent, such as propylene glycol methyl ether acetate, 2-heptanone or ethyl lactate, and optionally a water-soluble organic polar solvent, to the novolak resin reaction mixture from step a), at a ratio of photoresist solvent to optional water-soluble organic polar solvent of from 10/90 to 100/0, preferably 10/90 to 70/30, most preferably from 30/70 to 60/40;
c) feeding the mixture from step b) into a liquid/liquid centrifuge at a feed rate of from 0.04 to 400 liters per minute (L./min.) and at a temperature of from 0C up to a maximum temperature that is less than the boiling point of the lower boiling solvent in the mixture from step b), preferably up to 10° C. less than said boiling point, most preferably up to 20° C. less than said boiling point, and then feeding a substantially pure $C_5$–$C_8$ alkane, water or aromatic hydrocarbon solvent into the liquid/liquid centrifuge, preferably through a separate inlet port, at a feed rate of from 0.04 to 400 L/min., at a ratio of water-soluble organic polar solvent and photoresist solvent from step b) to $C_5$–$C_8$ alkane, water or aromatic solvent, of from 5:1 to 0.5:1, preferably from 2:1 to 1:0.75; (The feed rate is dependent upon the size of the centrifuge used. The CINC™ Model V2 centrifuged used in the Examples had a static volume of 140 ml., or a capacity of approximately 0.16 L/min. or 160 ml./min.)
d) rotating the liquid/liquid centrifuge containing the mixture from step c) at a speed of at least 500 rpm (revolutions per minute), preferably from 500 to 50,000 rpm, most preferably from 1,000 to 30,000 rpm, and thereby separating the mixture from step c) into two separate phases, and then collecting the two phases, each from 2 separate outlet ports, into two separate containers, wherein the heavier phase (H) contains the novolak resin fraction, in the optional water-soluble organic polar solvent and the photoresist solvent, with a minor amount (less than 5% by weight) of the $C_5$–$C_8$ alkane, water or aromatic hydrocarbon solvent, and the lighter phase (L) contains: 1) the low molecular weight novolak oligomers (1–5 repeating monomer units) and unreacted phenols fraction, 2) $C_5$–$C_8$ alkane, water or aromatic hydrocarbon solvent, 3) optional water-soluble organic polar solvent, and 4) photoresist solvent;
e) as the lighter phase (L) of the two-phase system of step d) is collected it optionally separate into two second separate phases when the optional water-soluble organic polar solvent is utilized, the lighter of these two second optional phases containing the $C_5$–$C_8$ alkane, water or the aromatic hydrocarbon solvent and a minor amount (less than 5% by weight) of the optional water-soluble organic polar solvent and, preferably from 15–20%, of the photoresist solvent, the heavier of these two second phases containing low molecular weight novolak oligomers and unreacted phenolic compounds, dissolved in the optional water-soluble organic polar solvent and the photoresist solvent, with, preferably 10–15%, of the $C_5$–$C_8$ alkane, water or aromatic hydrocarbon solvent;
f) removing the residual $C_5$–$C_8$ alkane, water or aromatic hydrocarbon solvent from the heavier phase (H) from step d), such as by distilling the heavier phase (H), and leaving the novolak resin in the photoresist solvent. The resin solution may then be used upon demand for the preparation of photoresists. The distillation is carried out at a temperature below the boiling point of the photoresist solvent, preferably at a temperature of from 40° C. to 100° C., at a pressure from 20 mm of mercury to 760 mm of mercury for from 10 minutes to 30 minutes; and, optionally;
g) adding additional photoresist solvent and continuing distillation until the desired concentration of the novolak resin in substantially pure photoresist solvent is obtained.

The present invention further provides a process for producing a positive photoresist composition having superior lithographic performance. The subject process comprises: providing an admixture of: 1) a photosensitive component in an amount sufficient to photosensitize a photoresist composition; 2) the film forming novolak resin solution produced by the above-described process of the present invention and 3) additional photoresist solvent, as needed to produce the desired formulation, and thereby forming a light-sensitive photoresist composition.

The invention further provides a method for producing a microelectronic device by producing a photo-image on a substrate by coating a suitable substrate with a positive working photoresist composition. The subject process comprises:

a) coating a suitable substrate with a photoresist composition produced by the above-described process containing a novolak resin produced by the above-described process of the present invention;

b) heat treating the coated substrate of step a) and thereby removing the photoresist solvent; image-wise exposing the photosensitive composition and removing the image-wise exposed areas of such composition with a suitable developer, such as an aqueous alkaline developer. Optionally one may also perform a baking of the substrate either immediately before or after the removing step.

DESCRIPTION OF THE PREFERRED EMBODIMENTS

Novolak resins have been commonly used in the art of photoresist manufacture as exemplified by "Chemistry and Application of Phenolic Resins", Knop A. And Scheib, W.; Springer Verlag, New York, 1979 in Chapter 4. Similarly, o-quinone diazide sulfonic acid esters are well known to the skilled artisan as demonstrated by "Light Sensitive Systems", Kosar, J.; John Wiley & Sons, New York, 1965 Chapter 7.4. However, the instant invention has found that the use of novolak resins isolated utilizing the process of the present invention by the separation of fractionated novolak resin in the heaviest layer of a 2- or 3-layer separation, using a liquid/liquid centrifuge, provides comparable or better lithographic performance at a fraction of the time required with traditional isolation/fractionation processes. The instant invention shows that using such a fractionation and separation process, useful novolak resins can be made for use in photoresist compositions.

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to about 95% by weight of the solids in the composition. Solvents, of course are substantially removed after coating of the photoresist solution on a substrate and subsequent drying. Non-ionic surfactants that may also be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coating produced by the described procedure is particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing a hexaalkyl disilazane, preferably hexamethyl disilazane (HMDS).

The photoresist composition solution is then coated onto the substrate, and the substrate is treated at a temperature from 70° C. to 110° C. for from 30 seconds to 180 seconds on a hot plate or for from 15 to 90 minutes in a convection oven. This temperature treatment is selected in order to reduce the concentration of residual solvents in the photoresist, while not causing substantial thermal degradation of the photosensitizer. In general, one desires to minimize the concentration of solvents in the photoresist coating and this first temperature treatment (soft bake) is conducted until substantially all of the solvents have evaporated and a thin coating of photoresist composition, on the order of one micron in thickness, remains on the substrate. In a preferred embodiment the temperature is from 85° C. to 95° C. The heat treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist coating is then optionally subjected to a post exposure second baking or heat treatment, either before or after development. The heating temperatures may range from 90° C. to 120° C., more preferably from 100° C. to 110° C. The heating may be conducted for from 30 seconds to 2 minutes, more preferably from 60 seconds to 90 seconds on a hot plate or from 30 to 45 minutes in a convection oven.

The exposed photoresist-coated substrate is then developed to remove the image-wise exposed areas by immersion in an alkaline developing solution or is developed using a spray development process. The solution is preferably agitated, for example, by nitrogen burst agitation. The substrate is allowed to remain in contact with the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight, all temperatures are in degrees Centigrade, and all molecular weights are weight average molecular weight.

EXAMPLE 1

A Novolak resin was synthesized by condensing formaldehyde with a mixture of 55% meta-cresol and 45% para-cresol at a ratio of 0.7 mole of formaldehyde to 1 mole of total cresols (meta cresol plus para cresol). The reaction was run with about 0.3% (by weight of solids) of an oxalic acid catalyst. After reacting the mixture for about 6 hrs. at 90–95° C., the mixture was distilled at a temperature up to about 200° C., and then at 200° C. with 25–30 mm Hg vacuum, to remove unreacted cresols. The molten novolak resin was then poured into a crystallizing dish and allowed to cool. The solidified resin was then broken up and powdered by grinding the resin with a mortar and pestle.

EXAMPLE 2

1200 grams (gm) Novolak resin, produced according to the procedure of example 1, was dissolved in 2800 gm PGMEA to provide a 30% solids solution. This novolak resin solution was diluted to 20% solids by adding MeOH, so that the final solvent composition was 58% PGMEA and 42% MeOH. This solution was used as one of two inlet feed streams into a CINC™ model V2 liquid/liquid centrifuge. The other inlet feed stream was hexane. The pump speeds for each inlet stream had separate controls. Trials were run with a range of temperatures from 0–55° C., centrifuge rpm of from 1500–5000 (equating to g-forces between 100 and 800, respectively) and inlet feed ratios (and corresponding to outlet feed ratios) of from 3 parts of the novolak resin solution: 0.5 parts of the $C_5$–$C_8$ alkane or aromatic hydrocarbon, to 0.5 parts of the novolak resin solution: 2 parts of the $C_5$–$C_8$, alkane or hydrocarbon solvent. Using a CINC™ Model V2 liquid/liquid centrifuge having an internal volume of about 140 milliliters (ml), the inlet feed rates into the centrifuge, for the novolak resin solutions, were from 75 to 400 ml/min. Table I below shows the conditions used, the Mw determined by GPC, and the DR for the final product. The experiments, the results of which are set forth in Table I below, demonstrated that the present method effectively fractionated and separated a novolak resin.

Comparative DRs were run in AZ® 300 MIF tetramethyl ammonium hydroxide developer (available from AZ Electronic Materials, Clariant Corporation, Somerville, N.J.) comparing a sample of unfractionated novolak resin dissolved in PGMEA to the novolak resin solution obtained from the heaviest phase of the 3-phase separation. The DR measurement was run on a Xinix™ Model 2200 Process Monitor. Silicon wafers, primed with HMDS, were coated with 28% solids novolak resin solution at 110° C. for 60 seconds at a spin speed appropriate to provide a coated film thickness of 1.60±0.1 micrometers, as measured on a Nano™ 215 device using the 5 point 4-inch wafer program. A wafer was attached to the Xinix™ probe and was immersed in a bath of AZ® 300 MIF developer, until the resin was removed. Two wafers were run and averaged to obtain the DR as measured in Angstroms/second (Å/sec.). Whereas the unfractionated resin had a DR of about 200 Å/sec., the fractionated material had a DR of from 60 Å/sec to 90 Å/sec. Weight average molecular weights (Mw) measured by gel permeation chromatography (GPC), showed that the fractionated resin had a Mw of 9,500–12,000 whereas the unfractionated resin had a Mw of 7,500.

TABLE I

| Trial | Temp., ° C. | rpm | R/H | Mw, GPC | PD, Mw/Mn | DR, Å/sec. |
|---|---|---|---|---|---|---|
| 1 | 55 | 1000 | 2 | 9917 | 5.1 | — |
| 2 | 0 | 5000 | 1 | 9941 | 5.4 | — |
| 3 | 0 | 1000 | 2 | 9046 | 5.1 | — |
| 4 | 55 | 1000 | 0.5 | 11710 | 5.0 | 69.5 |
| 5 | 55 | 5000 | 2 | 9601 | 5.0 | — |
| 6 | 25 | 3500 | 2 | 9536 | 5.1 | — |
| 7 | 25 | 1000 | 1 | 10069 | 5.0 | — |
| 8 | 55 | 3500 | 1 | 10002 | 5.0 | — |
| 9 | 0 | 1000 | 0.5 | 8788 | 5.3 | — |
| 10 | 25 | 5000 | 0.5 | 9846 | 5.1 | — |
| 11 | 25 | 5000 | 2 | 10274 | 5.3 | — |
| 12 | 0 | 3500 | 2 | 10115 | 5.8 | — |
| 13 | 0 | 3500 | 0.5 | 9513 | 5.4 | — |
| 14 | 55 | 5000 | 1 | 12544 | 6.0 | 95.3 |
| 15 | 0 | 1000 | 1 | 9803 | 5.4 | — |

An unfractionated control sample had a Mw of 7500 and a DR of 200 Å/sec. with a polydispersity of 15.

R=pump speed of the inlet feed of a 20% solids novolak resin solution in 58% PGMEA142% MeOH (in ml./min.);

H=pump speed of the inlet feed of n-hexane (in ml./min.);

Mn=number average molecular weight;

Mw=weight average molecular weight;

PD=Polydispersity=Mw/Mn.

EXAMPLE 3

Another series of experiments was run according to the procedure of Example 2 and the centrifuge rpm was maintained at 3500 rpm (~500 g force). In this series, the variables were the composition of the novolak resin solution, the inlet feed rate of the novolak resin solution, the solvent used (where EL was used as the photoresist solvent in place of PGMEA) and the temperature, as shown in Table II below. The EL/MeOH ratio was held at 58%/42%. A DR ranging between 30 and 190 Å/sec. was obtained, as compared to an unfractionated resin that had a dissolution rate of 300 Å/sec. The results are shown in Table II below. All feed rates are in ml./min.

TABLE II

| Trial | Temp., °C. | R/H | Inlet Feed Rate/Novolak | Mw, GPC | PD | DR, Å/sec. |
|---|---|---|---|---|---|---|
| 1 | 55 | 2 | 400 | 11,247 | 8.8 | 137.9 |
| 2 | 40 | 2 | 400 | | 9.2 | 146.3 |
| 3 | 35 | 0.5 | 75 | 10,169 | 8.6 | 145.6 |
| 4 | 25 | 0.5 | 75 | 11,368 | 9.5 | 187.3 |
| 5 | 40 | 2 | 400 | 11,728 | 9.3 | 149.6 |
| 6 | 25 | 2 | 400 | 11,857 | 9.6 | 176.5 |
| 7 | 55 | 2 | 400 | 11,340 | 4.3 | 140 |
| 8 | 25 | 2 | 400 | 11,674 | 9.4 | 186.7 |
| 9 | 55 | 0.5 | 75 | 14,155 | 8.1 | 40.6 |
| 10 | 55 | 1 | 200 | 12,659 | 9.7 | 159.2 |
| 11 | 25 | 1.25 | 225 | 11,980 | 9.6 | 189.9 |
| 12 | 25 | 1.25 | 225 | 11,183 | 9.1 | 191.2 |
| 13 | 55 | 1.5 | 250 | 12,032 | 9.3 | 113.4 |
| 14 | 35 | 1.5 | 250 | 11,688 | 9.4 | 143.4 |
| 15 | 45 | 0.5 | 75 | 10,999 | 9.0 | 127.4 |
| 16 | 55 | 0.5 | 75 | 13,862 | 6.8 | 28.5 |

An fractionated control sample had a Mw of about 9000, a DR of 300 Å/sec and a PD15.

R=pump speed of the inlet feed of a 20% solids novolak resin solution in 58% EL/42% MeOH;

H=pump speed of the inlet feed of n-hexane.

EXAMPLE 4

A novolak resin was synthesized by condensing paraformaldehyde with a phenol mixture of 5 moles of meta-cresol, 4 moles of para-cresol, and 2 moles of 2,3,5-trimethyl phenol at a ratio of 0.7 mole of formaldehyde to 1 mole of phenol mixture. The reaction was run with 0.3% (by weight of solids) of an oxalic acid catalyst. After reacting the reaction mixture for 4 hrs. at 90–95° C., the mixture was distilled up to about 200° C. and then at 200° C. with 25–30 mm Hg vacuum to remove unreacted phenols. The molten resin was poured into a crystallizing dish and allowed to cool. The solidified novolak resin was then broken up and powdered by grinding the novolak resin with a mortar and pestle.

A 20% solids solution of the above novolak resin was made by dissolving 270 grams of the solid novolak resin in 875.5 grams of MeOH and 229.1 grams of EL. This solvent composition was 79.3% MeOH and 20.7% EL. To this solution, 341.5 grams of deionized water was added and the mixture was fed through one inlet, at a rate of 200 milliliters (ml.) per minute at room temperature, into a CINC™ model V-2 liquid/liquid centrifuge running at 4000 rpm (~600 g force). The mixture was efficiently separated into two distinct layers, the heavy layer containing one phase and the lighter layer containing two other phases, which remained as a mixture. The lighter layer and the heavy layer were removed from the centrifuge through two separate outlet feeds, each at a rate of about 200 ml./min. The heavy layer was collected, and water was removed by vacuum distillation until the final solution was 30% solids in substantially pure EL.

Comparative DRs were run in AZ® 300 MIF developer by the method described in example 2. A sample of unfractionated resin dissolved in ethyl lactate solution was compared to the resin obtained from the heavier phase of the phase separation. Whereas the unfractionated resin had a DR of 800 Å/sec., the fractionated material had a DR of 60 Å/sec. Molecular weights (Mw) by gel permeation chromatography (GPC) showed that the fractionated resin had an Mw of 5147 whereas the unfractionated resin had an Mw of 2104.

EXAMPLE 5

| | |
|---|---|
| NK-280 (a proprietary 2,1,5-diazonaphthoquinone sulfonyl chloride sensitizer available from Nippon Zeon Co) | 2.02 gm |
| NK-240 (a proprietary 2,1,4-diazonaphthoquinone sulfonyl chloride sensitizer available from Nippon Zeon Co.) | 0.84 gm |
| Fractionated novolak Resin from Example 4 | 22.58 gm |
| B126X-SH proprietary speed enhancer resin available from Nippon Zeon Co. | 1.20 gm |
| KP-341, a striation free surfactant Available from Shinetsu Chem. Co. (2% in EL) | 0.004 gm |
| Additional ethyl acetate | 17.15 gm |
| n-Butyl Acetate | 5.85 gm |

The photoresist composition was coated on an HMDS primed silicon wafer to a 1.083 micrometer ($\mu$m) film thickness, which was then soft baked at 90° C. for 60 seconds on a hot plate. The focus exposure matrix was printed on the coated wafer using a 0.54 NA NIKON® i-line stepper and a NIKON® resolution reticle. The exposed wafer was PEB (post exposure baked) at 110° C. for 70 seconds on an in-line hot plate. The wafer was then developed using AZ® 300 MIF (TMAH, tetramethyl ammonium hydroxide—2.38%) developer for 60 seconds at 21° C. The developed wafer was examined using a HITACHI(® S-4000 SEM (scanning electron microscope). A nominal dose (Dose to Print, DTP) was measured at the best focus by choosing the exposure at which the printed feature most closely matched the mask feature size on the developed SEM photo. For this resist, the dose required to precisely replicate a given feature was 290 millijoules/$Cm^2$. Resolution is the minimum feature size which can be discriminated (resolved) and was 0.32 $\mu$m. Depth of focus is the range of usable focus at which nominal sizes can still be resolved. The depth of focus for this photoresist composition was 1.0 $\mu$m (micrometer).

EXAMPLE 6

A novolak resin was synthesized by condensing paraformaldehyde with a phenol mixture of 5 moles of meta-cresol, 4 moles of para-cresol, and 2 moles of 2,3,5-trimethyl phenol at a ratio of 0.7 mole of formaldehyde to 1 mole of phenol mixture. The reaction was run with 0.3% (by weight of solids) of an oxalic acid catalyst. After reacting the mixture for 4 hrs. at 90–95° C., the mixture was distilled up to about 200° C. and then at 200° C. with 25–30 mm Hg vacuum, to remove unreacted phenols. The molten resin was poured into a crystallizing dish and allowed to cool. The solidified novolak resin was broken up and powdered by grinding the resin with a mortar and pestle.

A 30% solids solution of the novolak resin was prepared by dissolving 240 grams of novolak resin in 560 grams of EL. This solution was diluted to 20% solids by the addition of MeOH, such that the final solvent ratio was 58% EL to 42% MeOH. This solution was used as one inlet feed stream (R) into a CINC™ Model V2 liquid/liquid centrifuge with hexane as the other feed stream (H), using the procedure set forth in example 2. The R/H ratio was maintained at 1/1 by running the respective feed pumps at the same rate (0.4 L/min.), the temperature was 40° C. and the centrifuge spin speed was 3500 rpm. The heavy layer was distilled to remove residual MeOH and hexane, and was concentrated to 26% solids. The DR was measured according to the procedure described in example 2. The fractionated resin of this example had a DR of 270 Å/sec. and a Mw of 6365, while the unfractionated resin had a DR of 600 Å/sec. and a Mw of 2860.

EXAMPLE 7

300 gm of an unfractionated novolak resin prepared according to the procedure set forth in paragraph 1 of Example 4 was dissolved in 2700 gm of ethyl lactate to provide a 20% solids resin solution. This solution was used as one inlet feed stream (R) into a CINC™ Model V2 liquid/liquid centrifuge with hexane as the other feed stream (H) using the procedure set forth in Example 2. The R/H ratio was maintained at 2/1 by running the R pump at 200 ml/minute and the H pump at 100 ml/minute; the temperature was 20–25° C. and the centrifuge spin speed was 3500 rpm. The heavy layer was distilled to remove traces of hexane and to concentrate the solution to 26% solids. The DR was measured according to the procedure described in Example 2. When compared to the DR of 686 Å/sec. and Mw of 2383 for the unfractionated resin, the fractionated novolak resin of this example had a DR of about 584 Å/sec. and a Mw of 2653. The yield of fractionated resin was about 80%.

EXAMPLE 8

300 gm of an unfractionated novolak resin prepared according to the procedure set forth in paragraph 1 of Example 4 was dissolved in 2700 gm of ethyl lactate to provide a 20% solids resin solution. This solution was used as one inlet feed stream (R) with hexane as the other feed stream (H) using conditions similar to those found in Example 2. The R/H ratio was maintained at 1/2 by running the R pump at 100 ml/minute and the H pump at 200 ml/minute; the temperature was 20–25° C. and the centrifuge spin speed was 3500 rpm. The heavy layer was distilled to remove traces of hexane and to concentrate the solution to 26% solids. The dissolution rate (DR) was measured according to the procedures described in Example 2. When compared to the DR of 686 Å/sec. and Mw of 2383 for the unfractionated resin, the fractionated novolak resin of this example had a DR of about 533 Å/sec. and a Mw of 2870. The yield of resin was about 65%.

EXAMPLE 9

300 gm of an unfractionated m-cresol novolak resin (available from Asahi Yuki Company in Japan) was dissolved in 1200 gm of acetone to provide a 20% solids solution. This solution was used as one inlet feed stream (R), with pentane as the other feed stream (H), into a CINC™ Model V02 liquid/liquid centrifuge. The R/H ratio was maintained at 1/1 by running the R pump at 150 ml/minute and the H pump at 150 ml/minute; the temperature was 25° C. and the centrifuge spin speed was 3500 rpm. The heavy layer was distilled to remove the acetone and pentane. The thick residue was dissolved in sufficient 2-heptanone to provide a solution to 26% solids. The DR was measured according to the procedure described in Example 2. Compared to the starting unfractionated novolak resin, which had a DR of 722 Å/sec. and a Mw of about 7,000, samples of the fractionated novolak resin of this example taken at two stages near the end of the fractionation had a DR of 103 Å/sec. and 118 Å/sec., and the final product had a Mw of 8,054.

Unless otherwise specified: 1) all Molecular weights (Mw) were weight average molecular weights measured by gel permeation chromatography (GPC); all parts and percents are by weight and all temperatures are in degrees Centigrade.

What we desire to claim is:

1. A method for producing a film forming novolak resin, which comprises, in the following order:
   a) condensing formaldehyde, para-formaldehyde or formalin with one or more phenolic compounds, in the presence of an acid catalyst and thereby producing a novolak resin;
   b) adding a photoresist solvent, and optionally a water-soluble organic polar solvent, to the novolak resin reaction mixture from step a), at a ratio of photoresist solvent to water soluble organic polar solvent of from 10/90 to 100/0;
   c) feeding the mixture from step b) into a liquid/liquid centrifuge at a feed rate of from 0.04 to 400 liters per minute and at a temperature of from 0° C. up to a maximum temperature that is less than the boiling point of the lower boiling solvent in the mixture from step b), and then feeding a substantially pure $C_5$–$C_8$ alkane, water or aromatic hydrocarbon solvent into the liquid/liquid centrifuge at a feed rate of from 0.04 to 400 liters/min., at a ratio of optional water-soluble organic polar solvent and photoresist solvent from step b) to $C_5$–$C_8$ alkane, water or aromatic solvent, of from 5:1 to 0.5:1;
   d) rotating the liquid/liquid centrifuge containing the mixture from step c) at a speed of at least 500 rpm and thereby separating the mixture from step c) into two phases, and then collecting the two phases, each from 2 separate outlet ports, into two separate containers, wherein the heavier phase (H) contains the novolak resin fraction, in the optional water-soluble organic polar solvent and the photoresist solvent with a minor amount of the $C_5$–$C_8$ alkane, water or aromatic hydrocarbon solvent, and the lighter phase (L) contains: 1) the novolak resin oligomer and unreacted phenols fraction, 2) $C_5$–$C_8$ alkane, water or aromatic hydrocarbon solvent, 3) optional water-soluble organic polar solvent, and 4) photoresist solvent;
   e) as the lighter phase (L) of the two-phase system of step d) is collected, optionally separating the lighter phase (L) into two second separate phases, the lighter of these two second phases containing the $C_5$–$C_8$ alkane, water or the aromatic hydrocarbon solvent and a minor amount of the water-soluble organic polar solvent and the photoresist solvent, the heavier of these two second phases containing low molecular weight novolak oligomers and unreacted phenolic compounds, dissolved in the optional water-soluble organic polar solvent and the photoresist solvent, with the $C_5$–$C_8$ alkane, water or aromatic hydrocarbon;
   f) removing residual $C_5$–$C_8$ alkane water or aromatic hydrocarbon solvent from the heavier phase (H) from step d) and leaving the novolak resin dissolved in the photoresist solvent.

2. The method of claim 1 wherein said acid catalyst is oxalic acid, maleic acid, maleic anhydride, sulfuric acid or p-toluene sulphonic acid.

3. The method of claim 1 wherein the optional water-soluble organic polar solvent optionally added in step b) is acetone, dimethylformamide, dimethylsulfoxide, tetrahydrofuran, ethylene glycol or a $C_1$–$C_5$ alkyl alcohol.

4. The method of claim 1 wherein the photoresist solvent added in step b) is a monooxymonocarboxylic acid ester, a propylene glycol methyl other acetate, 2-heptanone or a propylene glycol methyl ether, or a mixture of one or more of these.

5. The method claim 1 wherein aromatic hydrocarbon solvent added in step b) is benzene or a $C_1$–$C_5$ alkyl benzene.

6. The method of claim 1 wherein the ratio of photoresist solvent to optional water-soluble organic polar solvent added in step b) is from 10/90 to 70/30.

7. The method of claim 1 wherein the ratio of photoresist solvent to optional water-soluble organic polar solvent added in step b) is from 30/70 to 60/40.

8. The method of claim 1 wherein the ratio of the mixture from step b) fed into the centrifuge to the $C_5$–$C_8$ alkane, water or aromatic hydrocarbon solvent fed into the centrifuge is from 2:1 to 1:0.75.

9. The method of claim 1 wherein in step b) the materials are fed into the centrifuge at a temperature of from 0° C. to a temperature up to 10° C. less than the boiling point of the lower boiling solvent.

10. The method of claim 1 wherein the centrifuge is rotated at a speed of from 500 to 50,000 rpm.

11. The method of claim 1 wherein the centrifuge is rotated at a speed of from 1,000 to 30,000 rpm.

12. A method for producing a positive photoresist composition comprising, in the following order:
  a) condensing formaldehyde, para-formaldehyde or formalin with one or more phenolic compounds, in the presence of an acid catalyst and thereby producing a novolak resin;
  b) adding a photoresist solvent and an optional water-soluble organic polar solvent, to the novolak resin reaction mixture from step a), at a ratio of photoresist solvent to optional water-soluble organic polar solvent of from 10/90 to 100/0;
  c) feeding the mixture from step b) into a liquid/liquid centrifuge at a feed rate of from about 0.04 to 400 liters per minute and at a temperature of from about 0° C. up to a maximum temperature that is less than the boiling point of the lower boiling solvent in the mixture from step b), and feeding a substantially pure $C_5$–$C_8$ alkane, water or aromatic hydrocarbon solvent into the liquid/liquid centrifuge at a feed rate of from 0.04 to 400 liters/min., at a ratio of optional water-soluble organic polar solvent and photoresist solvent from step b) to $C_5$–$C_8$ alkane, water or aromatic solvent, of from 5:1 to 0.5:1;
  d) rotating the liquid/liquid centrifuge containing the mixture from step c) at a speed of at least 500 rpm and thereby separating the mixture from step c) into two separate phases, and then collecting the two phases, each from 2 separate outlet ports, into two separate containers, wherein the heavier phase (H) contains the novolak resin fraction, in the optional water-soluble organic polar solvent and the photoresist solvent, with a minor amount of the $C_5$–$C_8$ alkane, water or aromatic hydrocarbon solvent, and the lighter phase (L) containing: 1) the lower molecular weight novolak resin fraction, 2) $C_5$–$C_8$ alkane, water or aromatic hydrocarbon solvent, 3) optional water-soluble organic polar solvent, and 4) photoresist solvent;
  e) as the lighter phase (L) of the two-phase system of step d) is collected, it is optionally separated into two second separate phases when the optional water-soluble organic polar solvent is utilized, the lighter of these two second phases containing: the $C_5$–$C_8$ alkane, water or the aromatic hydrocarbon solvent and a minor amount of the optional water-soluble organic polar solvent and the photoresist solvent, the heavier of these two second phases containing low molecular weight novolak oligomers and unreacted phenolic compounds, dissolved in the optional water-soluble organic polar solvent and the photoresist solvent, with a minor amount of the $C_5$–$C_8$ alkane, water or aromatic hydrocarbon;
  f) removing residual $C_5$–$C_8$ alkane, water or aromatic hydrocarbon solvent from the heavier phase (H) from step d) and leaving the novolak resin dissolved in the photoresist solvent;
  g) providing an admixture of: 1) a photosensitive component in an amount sufficient to photosensitize a photoresist composition; 2) the film forming novolak resin solution from step f); and 3) additional photoresist solvent, if needed, to provide the desired formulation, and thereby forming a photoresist composition.

13. The method of claim 12 wherein said acid catalyst is oxalic acid, maleic acid, maleic anhydride, sulfuric acid, or p-toluene sulphonic acid.

14. The method of claim 12 wherein the optional water-soluble organic polar solvent added in step b) is acetone, dimethylformamide, dimethylsulfoxide, tetrahydrofuran, ethylene glycol or a $C_1$–$C_5$ alkyl alcohol.

15. The method of claim 12 wherein the photoresist solvent added in step b) is a monooxymonocarboxylic acid ester, a propylene glycol methyl ether acetate, 2-heptanone or a propylene glycol methyl ether, or a mixture of one or more of these.

16. The method claim 12 wherein aromatic hydrocarbon solvent added in step c) is benzene or a $C_1$–$C_5$ alkyl benzene.

17. The method of claim 12 wherein the ratio of photoresist solvent to optional water-soluble organic polar solvent added in step b) is from 10/90 to 70/30.

18. The method of claim 12 wherein the ratio of photoresist solvent to optional water-soluble organic polar solvent added in step b) is from 30/70 to 60/40.

19. The method of claim 12 wherein the ratio of the mixture from step b) fed into the centrifuge to the $C_5$–$C_8$ alkane, water or aromatic hydrocarbon solvent fed into the centrifuge is from 2:1 to 1:0.75.

20. The method of claim 12 wherein the in step b) the materials are fed into the centrifuge at a temperature of from 0° C. to a temperature up to 10° C. less than the boiling point of the lower boiling solvent.

21. The method of claim 12 wherein the centrifuge is rotated at a speed of from 500 to 50,000 rpm.

22. The method of claim 12 wherein the centrifuge is rotated at a speed of from 1,000 to 30,000 rpm.

23. A method for producing a microelectronic device by producing a photo-image on a substrate by coating a suitable substrate with a positive working photoresist composition comprising, in the following order:
  a) condensing formaldehyde, para formaldehyde or formalin with one or more phenolic compounds, in the presence of an acid catalyst and thereby producing a novolak resin;
  b) adding a photoresist solvent, and optionally a water-soluble organic polar solvent, to the novolak resin reaction mixture from step a), at a ratio of photoresist solvent to optional water-soluble organic polar solvent of from 10/90 to 100/0;

c) feeding the mixture from step b) into a liquid/liquid centrifuge at a feed rate of from 0.01 to 100 gallons per minute and at a temperature of from 0° C. up to a maximum temperature that is less than the boiling point of the lower boiling solvent in the mixture from step b) and feeding a substantially pure $C_5$–$C_8$ alkane, water or aromatic hydrocarbon solvent into the liquid/liquid centrifuge at a feed rate of from 0.01 to 100 gal./min., at a ratio of optional water-soluble organic polar solvent and photoresist solvent from step b) to $C_5$–$C_8$ alkane, water or aromatic solvent, of from 5:1 to 0.5:1;

d) rotating the liquid/liquid centrifuge containing the mixture from step c) at a speed of at least 500 rpm and thereby separating the mixture from step c) into two phases, and then collecting the two phases, each from 2 separate outlet ports, into two separate containers, wherein the heavier phase (H) contains the novolak resin fraction, in the optional water-soluble organic polar solvent and the photoresist solvent, with a minor amount of the $C_5$–$C_8$ alkane, water or aromatic hydrocarbon solvent, and the lighter phase (L) containing: 1) the novolak resin oligomer and unreacted phenols fraction, 2) $C_5$–$C_8$ alkane, water or aromatic hydrocarbon solvent, 3) optional water-soluble organic polar solvent, and 4) photoresist solvent;

e) as the lighter phase (L) of the two-phase system of step d) is collected, optionally separating the lighter phase (L) into two second phases, the lighter of these two second phases containing the $C_5$–$C_8$ alkane, water or the aromatic hydrocarbon solvent and a minor amount of the optional water-soluble organic polar solvent and the photoresist solvent, the heavier of these two second phases containing low molecular weight novolak oligomers and unreacted phenolic compounds, dissolved in the optional water-soluble organic polar solvent and the photoresist solvent, with the $C_5$–$C_8$ alkane, water or aromatic hydrocarbon;

f) removing residual $C_5$–$C_8$ alkane, water or aromatic hydrocarbon solvent from the heavier phase (H) from step d) and leaving the novolak resin dissolved in the photoresist solvent;

g) providing an admixture of: 1) a photosensitive component in an amount sufficient to photosensitize a photoresist composition, 2) the film forming novolak resin solution from step f) and 3) additional photoresist solvent needed to produce the desired photoresist composition;

h) coating a suitable substrate with the photoresist composition of step g);

i) heat treating the coated substrate of step h) until substantially all of the photoresist solvent is removed; image-wise exposing the photosensitive composition and removing the image-wise exposed areas of such composition with a suitable developer.

24. The method of claim 23 wherein the acid catalyst is oxalic acid, maleic acid, maleic anhydride, sulfuric acid, or p-toluene sulphonic acid.

25. The method of claim 23 wherein the water soluble organic polar solvent added in step b) is acetone, dimethylformamide, dimethylsulfoxide, tetrahydrofuran, ethylene glycol or a $C_1$–$C_5$ alkyl alcohol.

26. The method of claim 23 wherein the photoresist solvent added in step b) is a monooxymonocarboxylic acid ester, a propylene glycol methyl ether acetate, 2-heptanone or a propylene glycol methyl ether, or a mixture of one or more of these.

27. The method claim 23 wherein aromatic hydrocarbon solvent added in step b) is benzene or a $C_1$–$C_5$ alkyl benzene.

28. The method of claim 23 wherein the ratio of photoresist solvent to optional water-soluble organic polar solvent added in step b) is from 10/90 to 70/30.

29. The method of claim 23 wherein the ratio of photoresist solvent to optional water-soluble organic polar solvent added in step b) is from 30/70 to 60/40.

30. The method of claim 23 wherein the ratio of the mixture from step b) fed into the centrifuge to the $C_5$–$C_8$ alkane, water or aromatic hydrocarbon solvent fed into the centrifuge is from 2:1 to 1:0.75.

31. The method of claim 23 wherein in step b) the materials are fed into the centrifuge at a temperature of from 0° C. to a temperature up to 10° C. less than the boiling point of the lower boiling solvent.

32. The method of claim 23 wherein the centrifuge is rotated at a speed of from 500 to 50,000 rpm.

33. The method of claim 23 wherein the centrifuge is rotated at a speed of from 1,000 to 30,000 rpm.

* * * * *